US012663585B2

(12) United States Patent
Cho et al.

(10) Patent No.: US 12,663,585 B2
(45) Date of Patent: Jun. 23, 2026

(54) FAN-OUT CO-PACKAGED INTEGRATED SYSTEMS INCLUDING A PHOTONIC INTEGRATED CIRCUIT

(71) Applicant: GlobalFoundries U.S. Inc., Malta, NY (US)

(72) Inventors: Jae Kyu Cho, Niskayuna, NY (US); Norman Robson, Fishkill, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 313 days.

(21) Appl. No.: 18/241,289

(22) Filed: Sep. 1, 2023

(65) Prior Publication Data

US 2025/0076575 A1 Mar. 6, 2025

(51) Int. Cl.
| | |
|---|---|
| *G02B 6/13* | (2006.01) |
| *G02B 6/12* | (2006.01) |
| *G02B 6/122* | (2006.01) |
| *H10W 74/01* | (2026.01) |
| *H10W 90/00* | (2026.01) |
| *H10W 70/09* | (2026.01) |
| *H10W 70/60* | (2026.01) |

(52) U.S. Cl.
CPC ........... *G02B 6/13* (2013.01); *G02B 6/12004* (2013.01); *G02B 6/1228* (2013.01); *H10W 74/019* (2026.01); *H10W 90/00* (2026.01); *H10W 70/09* (2026.01); *H10W 70/60* (2026.01)

(58) Field of Classification Search
CPC .............................. G02B 6/12004; G02B 6/13
See application file for complete search history.

(56) References Cited

U.S. PATENT DOCUMENTS

| | | | |
|---|---|---|---|
| 9,396,999 B2 | 7/2016 | Yap et al. | |
| 9,754,835 B2 | 9/2017 | Scanlan et al. | |
| 10,302,868 B2 | 5/2019 | Horibe et al. | |
| 10,365,436 B2 | 7/2019 | Byrd et al. | |
| 2016/0359100 A1* | 12/2016 | Bhushan | H10N 50/80 |
| 2018/0233462 A1* | 8/2018 | Gong | H10W 42/00 |
| 2018/0299628 A1 | 10/2018 | Liu et al. | |
| 2019/0146166 A1* | 5/2019 | Wang | G02B 6/4246 385/14 |
| 2019/0162901 A1* | 5/2019 | Yu | H05K 1/112 |

(Continued)

FOREIGN PATENT DOCUMENTS

EP 3929641 A1 * 12/2021

OTHER PUBLICATIONS

Ibrahim Murat Soganci, Antonio La Porta, and Bert Jan Offrein, "Flip-chip optical couplers with scalable I/O count for silicon photonics," Optics Express 21, 16075-16085 (2013).

(Continued)

*Primary Examiner* — Michael Stahl
(74) *Attorney, Agent, or Firm* — Thompson Hine LLP; Anthony Canale

(57) ABSTRACT

Structures for a co-packaged photonics chip and electronic chip, and associated methods. The structure comprises a layer comprising a molding compound, an electronic chip and a photonics chip affixed in the layer, and a waveguiding structure including a waveguide core adjacent to the photonics chip. The photonics chip includes an optical coupler, the waveguide core includes a portion that overlaps with the optical coupler, and the waveguide core comprises a polymer.

14 Claims, 2 Drawing Sheets

(56) References Cited

U.S. PATENT DOCUMENTS

| | | | | |
|---|---|---|---|---|
| 2019/0237430 A1* | 8/2019 | England | ................. | H10P 54/00 |
| 2020/0174187 A1* | 6/2020 | Chang | ..................... | G02B 6/12 |
| 2021/0066269 A1* | 3/2021 | Yang | .................. | H01L 23/5389 |
| 2021/0202562 A1* | 7/2021 | Chang | ..................... | H01L 21/56 |
| 2021/0223489 A1* | 7/2021 | Weng | ..................... | H01L 24/16 |
| 2021/0407909 A1 | 12/2021 | Jadhav et al. | | |
| 2022/0328704 A1* | 10/2022 | Tsuchizawa | .......... | H10F 30/221 |
| 2022/0342164 A1* | 10/2022 | Chen | .................. | H01L 21/4871 |
| 2022/0365297 A1* | 11/2022 | Weng | ..................... | H01L 24/73 |
| 2023/0204879 A1* | 6/2023 | Kim | ..................... | G02B 6/4249 |
| | | | | 385/33 |
| 2024/0337799 A1* | 10/2024 | Ravichandran | ...... | G02B 6/4238 |
| 2024/0369783 A1* | 11/2024 | Yu | ........................ | G02B 6/4283 |

OTHER PUBLICATIONS

T. Barwicz et al., "Advances in Interfacing Optical Fibers to Nanophotonic Waveguides via Mechanically Compliant Polymer Waveguides," in IEEE Journal of Selected Topics in Quantum Electronics, vol. 26, No. 2, pp. 1-12, Mar.-Apr. 2020, Art No. 3700312, doi: 10.1109/JSTQE.2020.2964383.

* cited by examiner

FAN-OUT CO-PACKAGED INTEGRATED SYSTEMS INCLUDING A PHOTONIC INTEGRATED CIRCUIT

BACKGROUND

The present disclosure relates generally to semiconductor devices and integrated circuit fabrication and, more specifically, to structures for a co-packaged photonics chip and electronic chip, and associated methods.

Photonics chips are used in many applications and systems including, but not limited to, data communication systems and data computation systems. A photonics chip includes a photonic integrated circuit comprised of photonic components, such as modulators, polarizers, and optical couplers, that are used to manipulate light received from a light source, such as an optical fiber or a laser.

Photonics chips and electronic chips may be co-packaged into a single system. However, achieving a high bandwidth and providing a cost-effective co-packaging solution is technically challenging with conventional co-integration approaches. One co-packaging approach involves attaching a photonics chip and an electronic chip to a printed circuit board laminate. However, the printed circuit board laminate and the associated wire bonds may depress the operational bandwidth due to elevated parasitics.

Improved structures for a co-packaged photonics chip and electronic chip, and associated methods, are needed.

SUMMARY

In an embodiment, a structure comprises a layer comprising a molding compound, an electronic chip and a photonics chip affixed in the layer, and a waveguiding structure including a waveguide core adjacent to the photonics chip. The photonics chip includes an optical coupler, the waveguide core includes a portion that overlaps with the optical coupler, and the waveguide core comprises a polymer.

In an embodiment, a method comprises forming a package assembly including an electronic chip and a photonics chip affixed in a layer comprising a molding compound. The photonics chip includes an optical coupler. The method further comprises forming a waveguide core of a waveguiding structure adjacent to the photonics chip. The waveguide core includes a portion that overlaps with the optical coupler, and the waveguide core comprises a polymer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
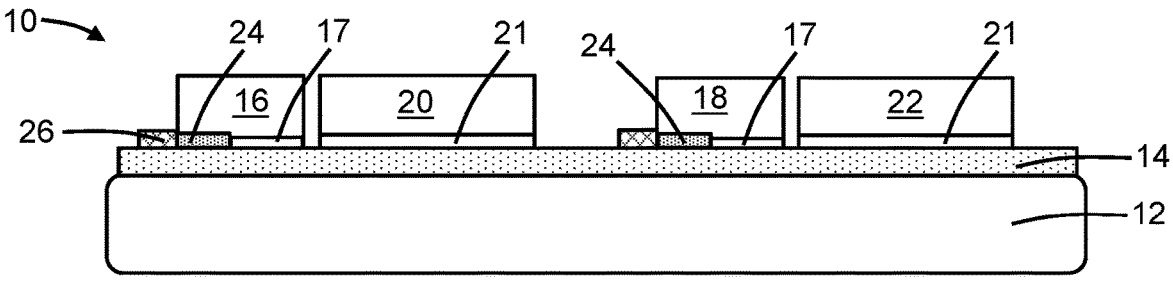
FIG. 1 is a cross-sectional view of a structure at an initial fabrication stage in accordance with embodiments of the invention.
Figure 1A:
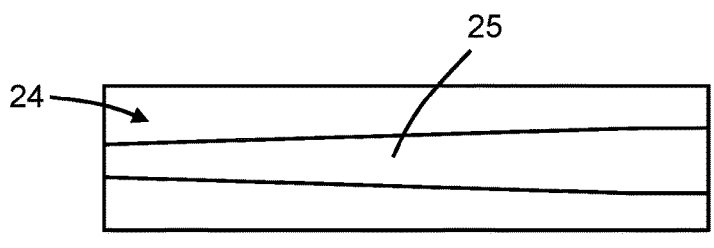
FIG. 1A is an enlarged bottom view of an optical coupler of each photonic chip in FIG. 1.

With reference to FIGS. 1, 1A and in accordance with embodiments of the invention, a structure 10 includes a carrier substrate 12, a release layer 14 coating a front surface of the carrier substrate 12, a photonics chip 16 and a photonics chip 18 each including a photonic integrated circuit, and an electronic chip 20 and an electronic chip 22 each including an electronic integrated circuit. The photonics chips 16, 18 and the electronic chips 20, 22 are attached to the carrier substrate 12 by the release layer 14. The carrier substrate 12 may be a glass support panel or a wafer, and the release layer 14 may be comprised of a sacrificial material providing a temporary bond that is releasable. In an embodiment, the release layer 14 may be configured to convert light to heat under laser irradiation in order to release the photonics chips 16, 18 and the electronic chips 20, 22 from the carrier substrate 12. The photonics chips 16, 18 and the electronic chips 20, 22 may be inverted such that the active side of the photonic integrated circuits of the photonics chips 16, 18 and the active side of the electronic integrate circuits of the electronic chips 20, 22 are bonded to the carrier substrate 12.

The photonics chip 16 is disposed on the carrier substrate 12 adjacent to the electronic chip 20, and the photonics chip 18 is disposed on the carrier substrate 12 adjacent to the electronic chip 22. The photonic integrated circuit of each of the photonics chips 16, 18 includes photonic components, such as modulators, polarizers, and optical couplers, that are configured to manipulate light received from a light source, such as an optical fiber or a laser. In particular, each of the photonics chips 16, 18 includes an optical coupler 24 that provides an interface for light transfer to and from the respective photonic integrated circuit. The optical couplers 24 may be disposed adjacent to the release layer 14. The optical couplers 24 may be, for example, inverse tapers 25 (FIG. 1A) that are comprised of patterned silicon or silicon nitride.

The active side of each of the photonics chips 16, 18 may also include a back-end-of-line stack 17 that has dielectric layers and interconnects in the dielectric layers that may be coupled with the photonic components, such as photodetectors and modulators, of the photonic integrated circuit are electrically active. Each back-end-of-line stack 17 may include bond pads, which are disposed adjacent to the release layer 14, that are used to establish external connections for electrically-active photonic components. In an embodiment, each back-end-of-line stack 17 may include an opening in which the optical coupler 24 is positioned. The opening in each back-end-of-line stack 17 may be filled by a homogeneous dielectric material, such as silicon dioxide, that replaces a removed portion of the back-end-of-line stack 17.

Each of the electronic chips 20, 22 includes electronic components, such as transistors, on its active side that form a functional electronic integrated circuit, such as an application-specific integrated circuit. The active side of each of the electronic chips 20, 22 also includes a back-end-of-line stack 21 that has dielectric layers and interconnects in the dielectric layers that may be coupled with the electronic components of the electronic integrated circuit. Each back-end-of-line stack 21 may include bond pads, which are disposed adjacent to the release layer 14, that are used to establish external connections.

Cladding layers 26 of respective waveguiding structures are formed on the release layer 14 adjacent to the optical coupler 24 of each of the photonics chips 16, 18. The optical coupler 24 of the photonics chip 16 and the adjacent cladding layer 26 may be disposed at an edge of the photonics chip 16 that is not obstructed by the electronic chip 20. The optical coupler 24 of the photonics chip 18 and the adjacent cladding layer 26 may be disposed at an edge of the photonics chip 18 that is not obstructed by the electronic chip 22. The cladding layers 26 may be formed by depositing a layer comprised of a polymer, such as an optical silicone, curing the deposited layer, and patterning the cured layer with lithography and etching processes.

Figure 2:
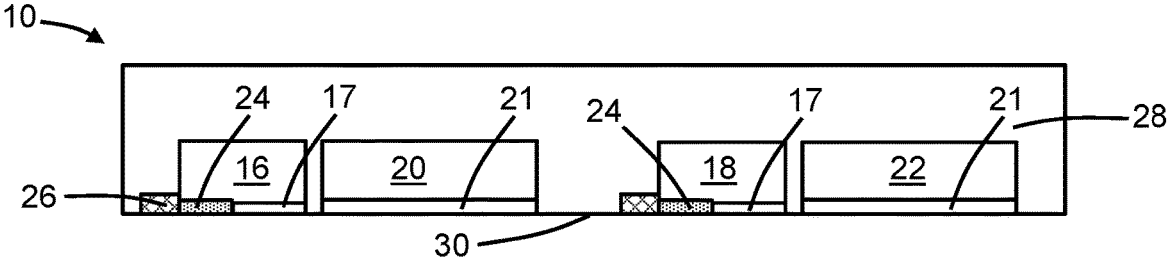
FIG. 2 is a cross-sectional view of the structure at a fabrication stage subsequent to FIG. 1.

With reference to FIG. 2 in which like reference numerals refer to like features in FIG. 1 and at a subsequent fabrication stage, a layer 28 is applied over the photonics chips 16, 18, the electronic chips 20, 22, and the cladding layers 26 to form a package assembly. The layer 28 may be comprised of a molding compound, such as an epoxy, and the layer 28 may be formed by a molding process. The photonics chips 16, 18, the electronic chips 20, 22, and the cladding layers 26 are affixed within the layer 28 beneath a surface 30 of the layer 28.

The back-end-of-line stacks 17 of the photonics chips 16, 18 and the back-end-of-line stacks 21 of the electronic chips 20, 22 may be coextensive with the surface 30 of the layer 28, which establishes an interface for optical and electrical communication with the photonics chips 16, 18 and electrical communication with the electronic chips 20, 22. In that regard, the bond pads of the back-end-of-line stacks 17 and the bond pads of the back-end-of-line stacks 21 may be accessible at the surface 30 of the layer 28. The cladding layers 26 of the waveguiding structures may be coextensive with the surface 30 of the layer 28, and the optical couplers 24 of the photonics chips 16, 18 may be disposed adjacent to the surface 30 of the layer 28.

The release layer 14 is processed to debond the photonics chips 16, 18, the electronic chips 20, 22, and the layer 28 from the carrier substrate 12. For example, the release layer 14 may be subjected to laser irradiation that is converted by the release layer 14 to heat, which elevates the temperature of the release layer 14 and reduces the adhesion such that the carrier substrate 12 can be removed. The photonics chips 16, 18, the electronic chips 20, 22, and the cladding layers 26, which are affixed inside the layer 28, are removed in the form of a package assembly. The layer 28 provides mechanical support during, and after, the removal of the carrier substrate 12, and the layer 28 also establishes static positions for the affixed photonics chips 16, 18 and electronic chips 20, 22.

Figure 3:
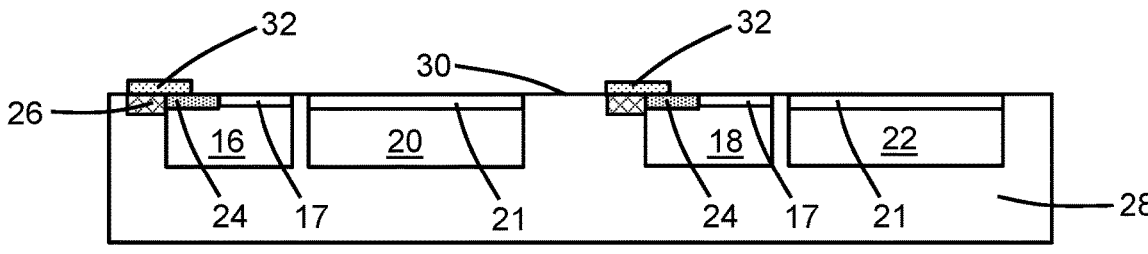
FIG. 3 is a cross-sectional view of the structure at a fabrication stage subsequent to FIG. 2.
Figure 3A:
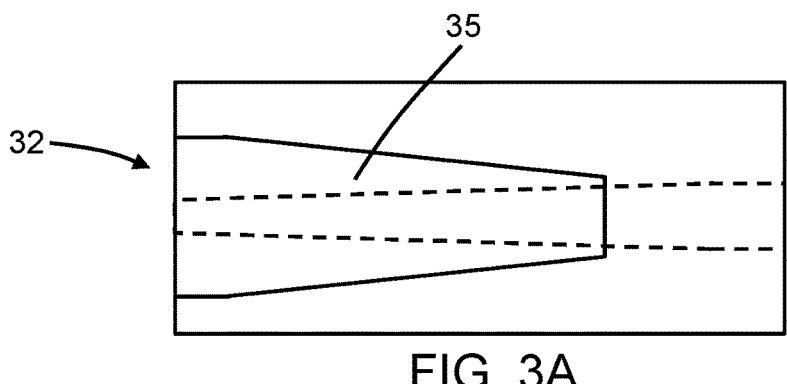
FIG. 3A is an enlarged top view of a waveguide core associated with the optical coupler of each photonic chip in FIG. 3.

With reference to FIGS. 3, 3A in which like reference numerals refer to like features in FIG. 2 and at a subsequent fabrication stage, the package assembly may be inverted and a waveguide core 32 may be formed at the surface 30 of the layer 28 adjacent to the optical coupler 24 of each of the photonics chips 16, 18. One of the waveguide cores 32 includes a portion that overlaps with the cladding layer 26 associated with the photonics chip 16 and a portion that overlaps with the optical coupler 24 associated with the photonics chip 16. The other of the waveguide cores 32 includes a portion that overlaps with the cladding layer 26 associated with the photonics chip 18 and a portion that overlaps with the optical coupler 24 associated with the photonics chip 18. In an embodiment, the portion of each waveguide core 32 that overlaps with the tapered section 25 of the associated optical coupler 24 may be a tapered section 35, as shown in FIG. 3A. In an embodiment, the tapered section 35 of each waveguide core 32 may be wider than the overlapped tapered section 25 of the associated optical coupler 24 and narrower than the underlying cladding layer 26. The overlapping optical coupler 24 and portion of the waveguide core 32 are configured for light coupling in order to enable the transfer of light to and from the photonics chips 16, 18.

The waveguide cores 32 of the waveguiding structures may be formed by depositing a layer comprised of a polymer, such as an optical silicone, curing the deposited layer, and patterning the cured layer with lithography and etching processes. The material constituting the waveguide cores 32 has an index contrast with the material constituting the cladding layers 26. In an embodiment, the polymer material constituting the waveguide cores 32 may have a refractive index that is greater than the refractive index of the polymer material constituting the cladding layers 26.

Figure 4:
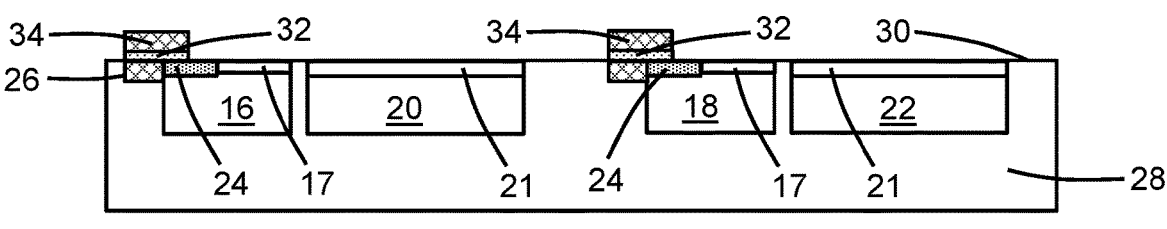
FIG. 4 is a cross-sectional view of the structure at a fabrication stage subsequent to FIG. 3.

With reference to FIG. 4 in which like reference numerals refer to like features in FIG. 3 and at a subsequent fabrication stage, a cladding layer 34 is formed on each waveguide core 32 and the underlying cladding layer 26. In an embodiment, the cladding layer 34 of each waveguiding structure may be wider than the associated waveguide core 32. The waveguide core 32 of each waveguiding structure is surrounded by a combination of the cladding layer 26 and cladding layer 34.

The cladding layers 34 may be formed by depositing a layer comprised of a polymer, such as an optical silicone, curing the deposited layer, and patterning the cured layer with lithography and etching processes. The material constituting the cladding layers 34 has an index contrast with the material constituting the waveguide cores 32. In an embodiment, the polymer material constituting the cladding layers 34 may have a refractive index that is less than the refractive index of the polymer material constituting the waveguide cores 32.

Figure 5:
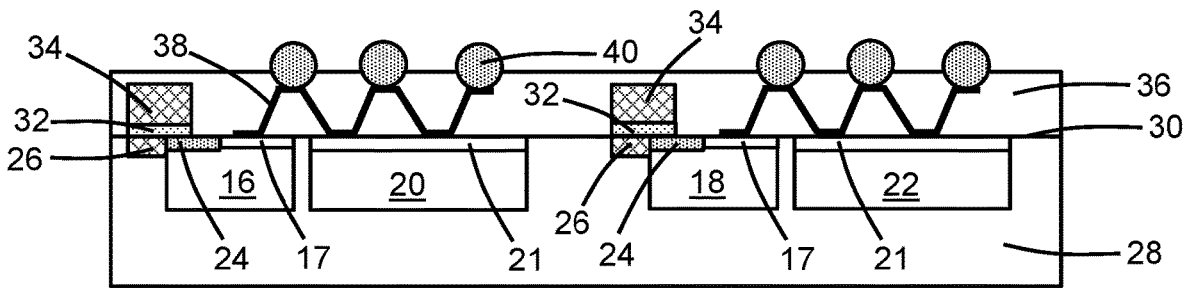
FIG. 5 is a cross-sectional view of the structure at a fabrication stage subsequent to FIG. 4.

With reference to FIG. 5 in which like reference numerals refer to like features in FIG. 4 and at a subsequent fabrication stage, the portion of the package assembly associated with the photonics chip 16 and the electronic chip 20 and the portion of the package assembly associated with the photonics chip 18 and the electronic chip 22 are converted to individual flip-chip packages. To that end, redistribution layers 38 are formed on the surface 30 of the layer 28. Each redistribution layer 38 includes interconnects disposed in one or more dielectric layers 36.

The interconnects of one of the redistribution layers 38 are associated with the back-end-of-line stack 17 of the photonics chip 16 and the back-end-of-line stack 21 of the electronic chip 20. The interconnects of the redistribution layer 38 may enable electrical communication between the photonics chip 16 and the electronic chip 20. The redistribution layer 38 may include input-output pads that enable electrical communication external of the flip-chip package to electrically-active photonic components of the photonic integrated circuit of the photonics chip 16, and that enable electrical communication external of the flip-chip package to the electronic integrated circuit of the electronic chip 20.

The interconnects of the other redistribution layer 38 are associated with the back-end-of-line stack 17 of the photonics chip 18 and the back-end-of-line stack 21 of the electronic chip 22. The interconnects of the redistribution layer 38 may enable electrical communication between the photonics chip 18 and the electronic chip 22. The redistribution layer 38 may include input-output pads that enable electrical communication external of the flip-chip package to electrically-active photonic components of the photonic integrated circuit of the photonics chip 18, and that enable electrical communication external of the flip-chip package to the electronic integrated circuit of the electronic chip 22.

Solder balls 40 may be formed in a ball grid array on the input/output pads of each redistribution layer 38 by a wafer-level bumping process. The solder balls 40 are coupled by the redistribution layers 38 to the photonic integrated circuits inside the photonics chips 16, 18 and to the electronic integrated circuits inside the electronic chips 20, 22.

Figure 6:
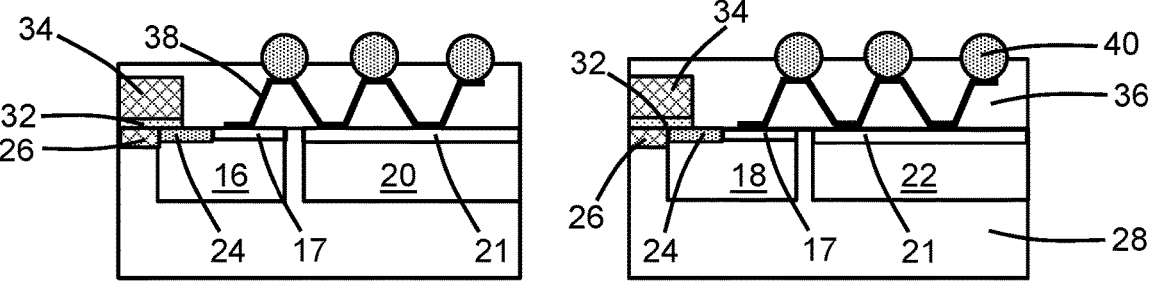
FIG. 6 is a cross-sectional view of the structure at a fabrication stage subsequent to FIG. 5.

With reference to FIG. 6 in which like reference numerals refer to like features in FIG. 5 and at a subsequent fabrication stage, the package assembly may be diced to singulate the flip-chip packages. One of the singulated flip-chip packages includes the photonics chip 16 and the electronic chip 20. The other singulated flip-chip package includes the photonics chip 18 and the electronic chip 22. Each of the singulated flip-packages may be subsequently attached to a substrate, such as a printed circuit board, by a pick-and-place operation and reflow of the solder balls 40. The singulation of the flip-chip packages may reveal the waveguide core 32 at an edge of the layer 28. An optical fiber, or other type of light source, may be coupled to the waveguide core 32.

The structure 10 defines a fan-out wafer-level co-packaged integrated system in the form of a flip-chip package that includes the photonics chip 16 and the electronic chip 20, and a fan-out wafer-level co-packaged integrated system in the form of a flip-chip package that includes the photonics chip 18 and the electronic chip 22. The fan-out wafer-level packaging embeds the individual chips in the layer 40 in the package assembly with space allocated for electrical connections and eventual singulation to form the flip-chip packages. The flip-chip packages provide a high-throughput and cost-effective co-packaged solution for co-packaging the photonics chips 16, 18 and the electronic chips 20, 22. The photonics chips 16, 18 and the electronic chips 20, 22 may be co-integrated employing the carrier substrate 12 and release layer 14 without bumping or the use of a printed circuit board laminate. The form factor of the flip-chip packages is compact and may lack both a printed circuit board laminate and a lid. The flip-chip packages may exhibit an enhanced bandwidth with low parasitics due to, for example, the elimination of printed circuit board laminate and the associated wire bonds. The layer 28 protects the fragile optical couplers 24 because the associated waveguide core 32 provides light transfer from an optical fiber through a portion of the layer 28 to the optical coupler 24 without physical contact with the optical fiber. The structure 10 may be expanded to fabricate more than a pair of flip-chip packages.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a layer comprising a molding compound, the layer including a surface;
   an electronic chip affixed in the layer, the electronic chip including a first back-end-of-line stack adjacent to the surface of the layer;
   a photonics chip affixed in the layer, the photonics chip including an optical coupler and a second back-end-of-line stack adjacent to the surface of the layer, and the optical coupler including a tapered section;
   a redistribution layer disposed on the surface of the layer, the redistribution layer including a plurality of interconnects configured to couple the first back-end-of-line stack in electrical communication with the second back-end-of-line stack; and
   a waveguiding structure including a waveguide core adjacent to the photonics chip, the waveguide core including a tapered section that overlaps with the tapered section of the optical coupler, and the waveguide core comprising a first polymer, wherein the optical coupler of the photonics chip and the tapered section of the waveguide core are disposed adjacent to the surface of the layer.

2. The structure of claim 1 wherein the waveguiding structure includes a first cladding layer and a second cladding layer, and the waveguide core includes a portion that is surrounded by the first cladding layer and the second cladding layer.

3. The structure of claim 2 wherein the first cladding layer is affixed in the layer below the surface, and the second cladding layer is disposed above the surface of the layer.

4. The structure of claim 2 wherein the first cladding layer comprises a second polymer with a different refractive index than the first polymer.

5. The structure of claim 2 wherein the second cladding layer comprises a second polymer with a different refractive index than the first polymer.

6. A method comprising:

forming a package assembly including an electronic chip and a photonics chip affixed in a layer comprising a molding compound, wherein the layer includes a surface, the electronic chip includes a first back-end-of-line stack adjacent to the surface of the layer, the photonics chip includes an optical coupler and a second back-end-of-line stack adjacent to the surface of the layer, and the optical coupler of the photonics chip is disposed adjacent to the surface of the layer;

forming a redistribution layer disposed on the surface of the layer, wherein the redistribution layer includes a plurality of interconnects configured to couple the first back-end-of-line stack in electrical communication with the second back-end-of-line stack; and forming a waveguide core of a waveguiding structure adjacent to the photonics chip, wherein the waveguide core includes a first portion that overlaps with the optical coupler, the first portion of the waveguide core is disposed adjacent to the surface of the layer, and the waveguide core comprises a polymer, wherein forming the package assembly including the electronic chip and the photonics chip affixed in the layer comprising the molding compound comprises:

attaching the electronic chip and the photonics chip in a removable manner to a carrier substrate; and forming the layer over the electronic chip and the photonics chip to form the package assembly; and wherein forming the waveguide core of the waveguiding structure adjacent to the optical coupler comprises:

removing the package assembly from the carrier substrate; and forming the waveguide core after the package assembly is removed from the carrier substrate.

7. The method of claim 6 wherein forming the package assembly including the electronic chip and the photonics chip affixed in the layer comprising the molding compound comprises:

forming a first cladding layer of the waveguiding structure that is affixed in the layer.

8. The method of claim 7 wherein the waveguide core includes a second portion, and the second portion of the waveguide core is formed on the first cladding layer.

9. The method of claim 8 further comprising:

forming a second cladding layer on the first cladding layer and the second portion of the waveguide core, wherein the second portion of the waveguide core is surrounded by the first cladding layer and the second cladding layer.

10. The structure of claim 1 wherein the redistribution layer is disposed directly on the surface of the layer.

11. The method of claim 6 wherein the redistribution layer is disposed directly on the surface of the layer.

12. The structure of claim 2 wherein the first cladding layer comprises a second polymer having a lower refractive index than the first polymer.

13. The structure of claim 2 wherein the second cladding layer comprises a second polymer having a lower refractive index than the first polymer.

14. The structure of claim 1 wherein the optical coupler comprises silicon or silicon nitride.

* * * * *